United States Patent
Su

(10) Patent No.: US 9,397,221 B2
(45) Date of Patent: Jul. 19, 2016

(54) THIN FILM TRANSISTOR, MANUFACTURING METHOD THEREOF AND THIN FILM TRANSISTOR ARRAY SUBSTRATE

(71) Applicant: Shenzhen China Star Optoelectronics Technology Co., Ltd., Shenzhen, Guangdong (CN)

(72) Inventor: Chih-yu Su, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 103 days.

(21) Appl. No.: 14/235,063

(22) PCT Filed: Dec. 5, 2013

(86) PCT No.: PCT/CN2013/088685
§ 371 (c)(1),
(2) Date: Jan. 26, 2014

(87) PCT Pub. No.: WO2015/078037
PCT Pub. Date: Jun. 4, 2015

(65) Prior Publication Data
US 2015/0249161 A1 Sep. 3, 2015

(30) Foreign Application Priority Data
Nov. 29, 2013 (CN) .......................... 2013 1 0631869

(51) Int. Cl.
*H01L 29/786* (2006.01)
*H01L 21/02* (2006.01)
*H01L 27/12* (2006.01)
*H01L 29/24* (2006.01)
*H01L 29/66* (2006.01)

(52) U.S. Cl.
CPC .... *H01L 29/78633* (2013.01); *H01L 21/02565* (2013.01); *H01L 27/1225* (2013.01); *H01L 29/24* (2013.01); *H01L 29/66969* (2013.01); *H01L 29/7869* (2013.01); *H01L 29/78618* (2013.01)

(58) Field of Classification Search
CPC ............... H01L 27/3272; H01L 29/78633; H01L 31/02164
See application file for complete search history.

(56) References Cited

U.S. PATENT DOCUMENTS

| 5,439,837 | A | 8/1995 | Hata | |
|---|---|---|---|---|
| 2005/0280123 | A1* | 12/2005 | Lee | H01L 21/2256 257/637 |
| 2014/0054579 | A1* | 2/2014 | Kim | H01L 29/786 257/43 |
| 2014/0295626 | A1* | 10/2014 | Park | C23F 1/18 438/151 |

FOREIGN PATENT DOCUMENTS

CN 103247659 A 8/2013

* cited by examiner

Primary Examiner — Jerome Jackson, Jr.
Assistant Examiner — David Spalla
(74) Attorney, Agent, or Firm — Andrew C. Cheng

(57) ABSTRACT

The present invention discloses a thin film transistor, comprising an active layer, a gate insulating layer, a gate electrode, a source electrode, and a drain electrode formed on a substrate. The active layer is above the substrate. The gate insulating layer, the source electrode, and the drain electrode are above the active layer. The gate electrode is above the gate insulating layer. Wherein, the thin film transistor further comprises a shielding layer between the substrate and the active layer, the shielding layer is used to absorb external light. The thin film transistor according to the present invention not only has strong stability, but also has high output efficiency. Moreover, the thin film transistor can follow the existing process, which facilitates mass production. The present invention further discloses a manufacturing method of the thin film transistor and a thin film transistor array substrate using the thin film transistor.

6 Claims, 5 Drawing Sheets

THIN FILM TRANSISTOR, MANUFACTURING METHOD THEREOF AND THIN FILM TRANSISTOR ARRAY SUBSTRATE

BACKGROUND OF THE INVENTION

1. Field of the Invention

The present invention relates to the technology fields of liquid crystal display, and in particular to a thin film transistor, the manufacturing method thereof, a thin film transistor array substrate and a liquid crystal panel.

2. The Related Arts

Thin flat panel display with small body and low power consumption is widely used. The existing thin flat panel display comprises liquid crystal display (LCD) and organic electroluminesence display (OLED).

Liquid crystal display (LCD) is consisted of color or monochrome pixels with a certain amount, which is placed in front of the light source or the reflector. Liquid crystal display has low power consumption, high image quality, small size, and light weight, so it is favored to become the mainstream of display.

Organic electroluminesence display is different from the liquid crystal display. It doesn't need backlight. It is consisted of an organic coating layer and a glass substrate. When current passes through, the organic materials will emit light. Organic electroluminesence display has the characteristics of self-luminous, high brightness, wide viewing angle, high contrast, flexible, low-power consumption, which receives widespread attention.

The thin film transistor (TFT) is usually used to drive the thin flat panel display, which realizes display screen information with high speed, high brightness, and high-contrast. Recently, metal oxide thin film transistor has several advantages of high mobility, good transparency, stable film structure, low production temperature and low cost, which receives more and more attention. Especially in the metal oxide TFT technology represented by indium gallium zinc oxide (In—Ga—Zn—O, IGZO), it can achieve higher resolution comparing with a-Si TFT and have high yields, low costs and energy conservation comparing with low temperature poly-silicon (LTPS) TFT. In summary, IGZO TFT technology has superior overall performance, which has a lot of breakthrough progress.

Referring to FIG. 1, the top-gate top-contact structure of the exiting IZGO TFT mainly comprises an IGZO layer 230, a gate insulating layer 240, a gate electrode 250, a passivation layer 260, a source electrode 270 and a drain electrode 280 formed on a substrate 210. Wherein, the IGZO layer 230 is an N-type semiconductor deposited on the substrate as a conducting channel. The source electrode 270 is a metal conductor deposited on the substrate 210 and coupled with one side of the IGZO layer 230, which is used to receive the source driving signal. The drain electrode 280 is a metal conductor deposited on the substrate 210 and coupled with the other side of the IGZO layer 230, which is used to receive the drain driving signal. The gate insulating layer 240 is an insulating layer deposited on the substrate 210, the IGZO layer 230, the source electrode 270, and the drain electrode 280, which is used to insulate the IGZO layer 230, the source electrode 270, and the drain electrode 280. The gate electrode 250 is a metal conductor deposited on the gate insulating layer 240, which is used to receive the gate driving signal. The passivation layer 260 is an insulating layer deposited on the gate insulating layer 240 and the gate electrode 250, which is used to protect the units. However, when the external light irradiate on the thin film transistor mentioned above, the light will affect the threshold voltage of the TFT, and the changes of the threshold voltage accompanying with bias stress will be accelerated, which will result in the display chaos of flat panel display. At the same time, the mobility of the semiconductor will be changed, which affects the resolution of the flat panel display. Moreover, the work function difference between the using metal of IGZO and that of the source electrode 270 and the drain electrode 280 is larger, so it results in larger contact resistance between the IGZO layer and the source electrode 270 and the drain electrode 280, which affects the output efficiency.

SUMMARY OF THE INVENTION

In order to solve the existing technical issue, an object of the present invention is to provide a thin film transistor, which can not only avoid the effects of light on the device performance, but also have high output efficiency.

In order to achieve the above object, an object of the present invention is to provide a thin film transistor, comprising an active layer, a gate insulating layer, a gate electrode, a source electrode, and a drain electrode formed on a substrate, the active layer being above the substrate, the gate insulating layer, the source electrode, and the drain electrode being above the active layer, the gate electrode being above the gate insulating layer; wherein, the thin film transistor further comprises a shielding layer between the substrate and the active layer, the shielding layer is used to absorb external light.

Furthermore, the shielding layer comprises a metal layer and an insulating layer above the metal layer, the metal layer is used to absorb external light, the insulating layer is used to separate the active layer and the metal layer.

Furthermore, the material of the active layer is indium gallium zinc oxide.

Furthermore, the first zone of the active layer contacting with the source electrode and the second zone of the active layer contacting with the drain electrode are n-type heavily doped region.

The second object of the present invention is to provide a manufacturing method of thin film transistor, comprising the following steps: A. forming a shielding layer on a substrate; B. forming an active layer on the shielding layer; C. forming a gate insulating layer on the active layer, and patterning the gate insulating layer, so that a first zone and a second zone of the active layer are exposed; D. forming a gate electrode on the gate insulating layer; E. forming a passivation layer on the substrate, the first zone, the second zone, and a gate electrode, and pattering the passivation layer, so that the first zone and the second zone are exposed; F. forming a source electrode and a drain electrode on the passivation layer, and the source electrode and the drain electrode respectively contacting with the first zone and the second zone.

Furthermore, the specific implementation of forming a shielding layer on a substrate in the step A is: A1. forming a metal layer on the substrate; A2. forming an insulating layer on the metal layer.

Furthermore, the material of the active layer is indium gallium zinc oxide.

Furthermore, the first zone of the active layer contacting with the source electrode and the second zone of the active layer contacting with the drain electrode are n-type heavily doped region.

The third object of the present invention is to provide a thin film transistor array substrate, comprising a transparent substrate and multiple thin film transistors arrayed on the transparent substrate, the thin film transistor comprising an active layer, a gate insulating layer, a gate electrode, a source electrode, and a drain electrode formed on a substrate, the active layer being above the substrate, the gate insulating layer, the source electrode, and the drain electrode being above the active layer, the gate electrode being above the gate insulating layer; wherein, the thin film transistor further comprises a shielding layer between the substrate and the active layer, the shielding layer is used to absorb external light.

Furthermore, the shielding layer comprises a metal layer and an insulating layer above the metal layer, the metal layer is used to absorb external light, the insulating layer is used to separate the active layer and the metal layer.

Furthermore, the material of the active layer is indium gallium zinc oxide.

Furthermore, the first zone of the active layer contacting with the source electrode and the second zone of the active layer contacting with the drain electrode are n-type heavily doped region.

The beneficial effects are as follows. The thin film transistor, the manufacturing method thereof, the thin film transistor array substrate, and the liquid crystal panel according to the present invention add a shielding layer to absorb external light, which reduces the effects of light on the device performance, increases the stability of the device, and then improves the quality of the flat panel display. At the same time, the thin film transistor utilizes a heavily doped n-type semiconductor to contact with the source electrode and the drain electrode, which reduces the contact resistance and increases output efficiency of the device. Moreover, the thin film transistor can follow the existing process, which facilitates mass production.

DETAILED DESCRIPTION OF THE PREFERRED EMBODIMENTS

In order to more clearly illustrate the embodiment of the present invention or the technical issue of the prior art, the accompanying drawings and the detailed descriptions are as follows.

Figure 1:
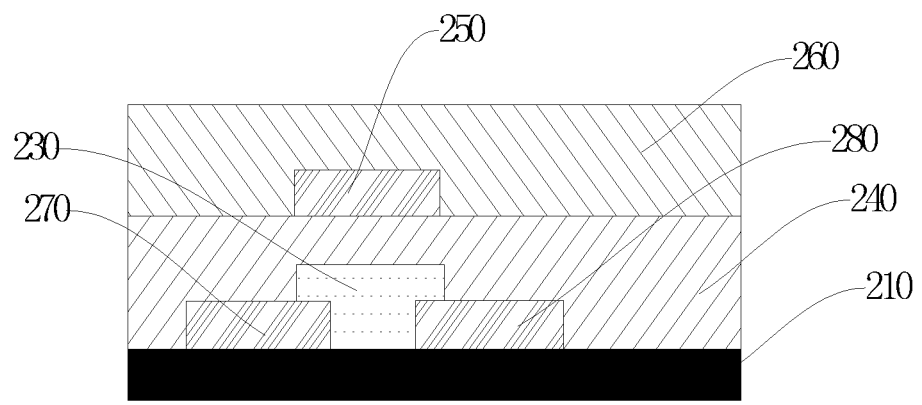
FIG. 1 is a schematic view illustrating the structure of a thin film transistor according to the existing technology.
Figure 2:
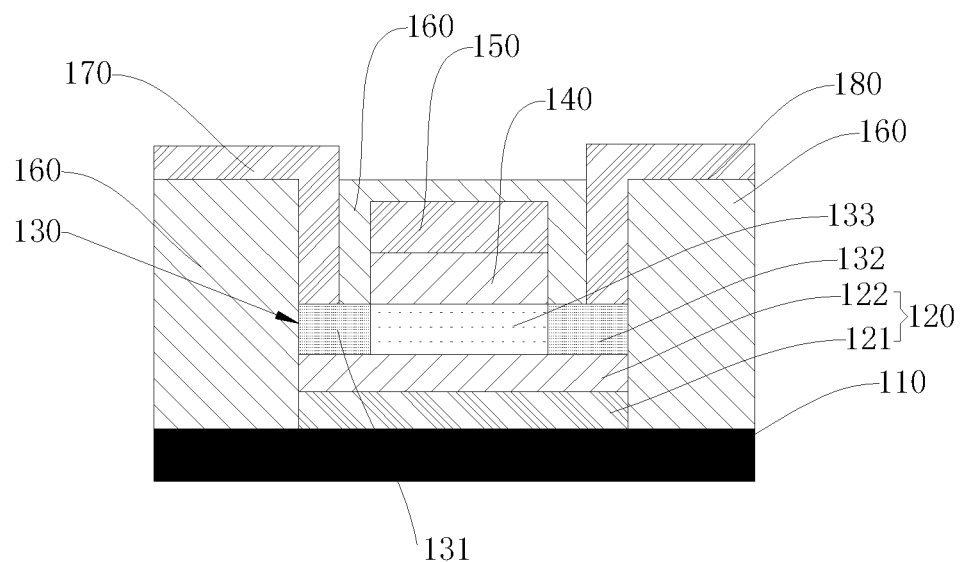
FIG. 2 is a schematic view illustrating the structure of a thin film transistor according to an embodiment of the present invention.

FIG. 2 is a schematic view illustrating the structure of a thin film transistor according to an embodiment of the present invention.

Referring to FIG. 2, the thin film transistor according to an embodiment of the present invention comprises a shielding layer 120, an active layer 130, a gate insulating layer 140, a gate electrode 150, a passivation layer 160, a source electrode 170, and a drain electrode 180 formed on a substrate 110.

Specifically, the shielding layer 120 is deposited on the substrate 110, which is used to absorb external light and then protects the units of the thin film transistor according to the present embodiment. The active layer 130 is a semiconductor layer deposited on the shielding layer 120 as a conductive channel, the material of which is IGZO in the present embodiment. The gate insulating layer 140 is an insulating layer deposited on the active layer 130, which is used to separate the gate electrode 150 and the active layer 130, the source electrode 170 and the drain electrode 180. In the present embodiment, the material of the gate insulating layer 140 can be silicon oxide; of course, it can be other insulating materials such as silicon nitride in the other embodiments. The gate electrode 150 is a metal conductor deposited on the gate insulating layer 140, which is used to receive the gate driving signal, the material of which is selected from the group consisting of Cr, Ti, Al, Mo, Cu, and Nd. The source electrode 170 is a metal conductor deposited on the one side of the active layer 130, which is used to receive the source driving signal, the material of which is selected from the group consisting of Cr, Ti, Al, Mo, Cu, and Nd. The drain electrode 180 is a metal conductor deposited on the other side of the active layer 130, which is used to receive the drain driving signal, the material of which is selected from the group consisting of Cr, Ti, Al, Mo, Cu, and Nd. The passivation layer 160 is an insulating layer deposited on the substrate 110, the active layer 130, and the gate electrode 150, which is used to protect the units of the thin film transistor. In the present embodiment, the material of the passivation layer 160 can be silicon oxide; of course, it can be other insulating materials such as silicon nitride in the other embodiments. Wherein, the gate electrode 150 can be located between the source electrode 170 and the drain electrode 180. The gate electrode 150 and the source electrode 170 are separated by the passivation layer 160, and the gate electrode 150 and the drain electrode 180 are separated by the passivation layer 160. Moreover, in the present embodiment, the substrate 110 provides support for the thin film transistor according to the present embodiment, the material of which is glass; of course, it can be flexible plastic in the other embodiments.

In addition, the shielding layer 120 comprises a metal layer 121 and an insulating layer 122. The metal layer 121 is used to absorb external light, and the insulating layer 122 is used to separate the active layer 130 and the metal layer 121. The material of the metal layer 121 is preferably chromium and/or chromium oxide, and the material of the insulating layer 122 is preferably silicon oxide, which can simplify the process. Of course, the material of the insulating layer 122 according to the other embodiments can be silicon nitride.

Figure 3A:
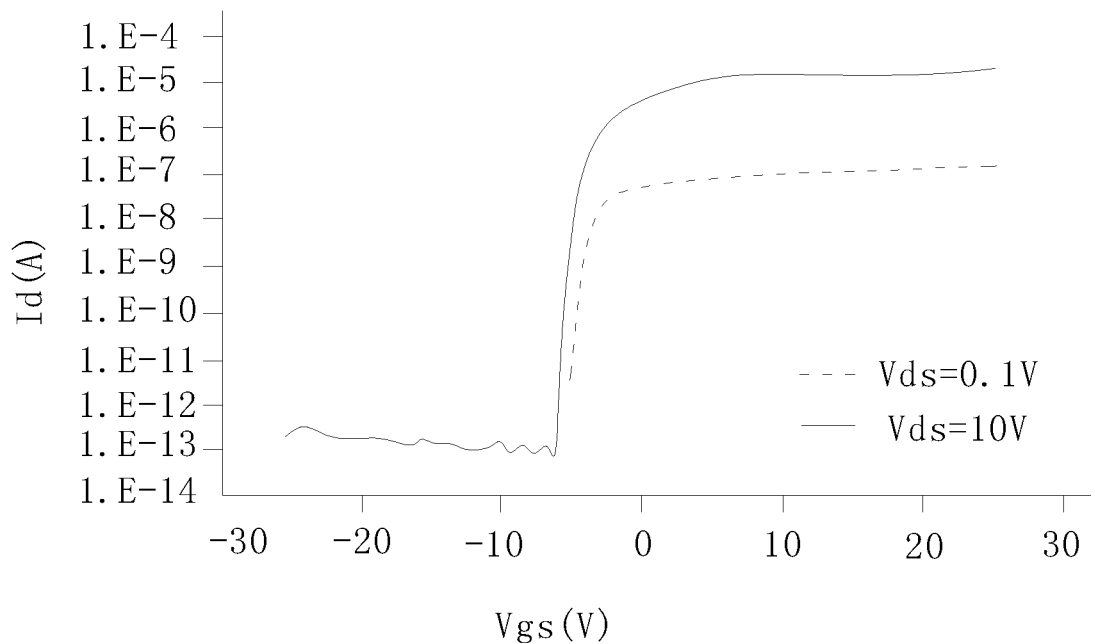
FIG. 3a is the transfer characteristic curve of the thin film transistor according to the existing technology.
Figure 3B:
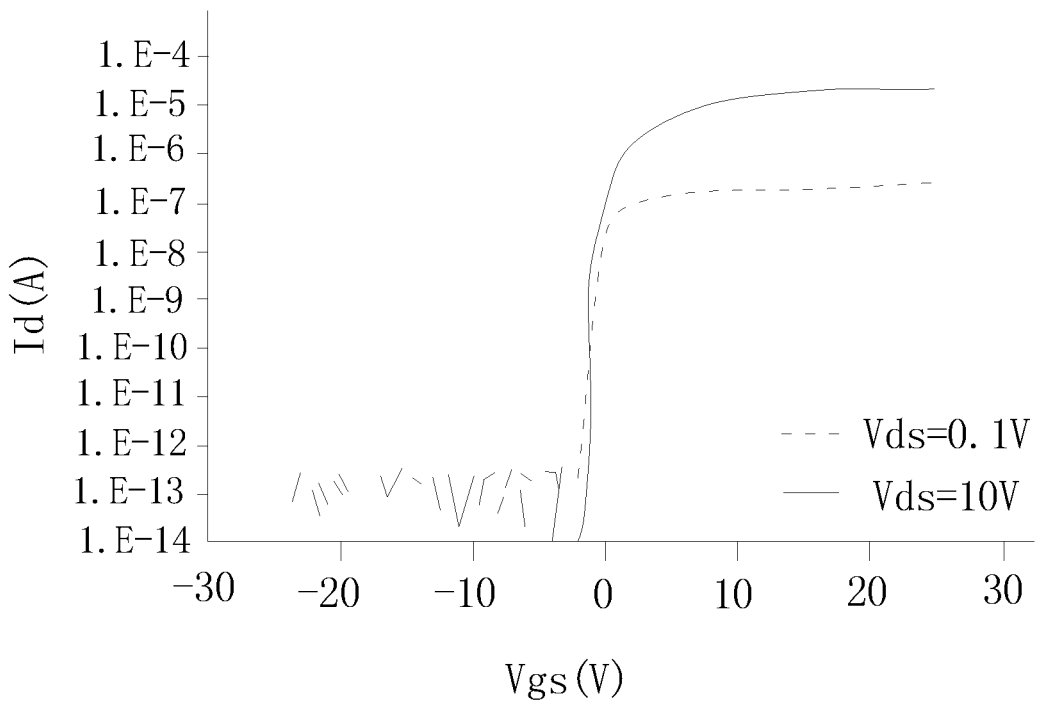
FIG. 3b is the transfer characteristic curve of the thin film transistor shown in FIG. 2.

FIG. 3a is the transfer characteristic curve of the thin film transistor according to the existing technology; FIG. 3b is the transfer characteristic curve of the thin film transistor according to the present embodiment.

Referring to FIGS. 3a and 3b, when the voltage difference between the drain and the source of the thin film transistor according to the existing technology is 0.1V or 10V, the threshold voltages are negative, that is, the threshold voltage of the thin film transistor according to the existing technology has negative bias voltage. Therefore, when the input voltage of the gate electrode is negative, the thin film transistor according to the existing technology will be cut off; on the contrary, when the input voltage of the gate electrode is a smaller negative value, the thin film transistor according to the existing technology will be turned on, which should be avoid in the thin film transistor of the flat panel display. In the presence of the shielding layer 120 in the thin film transistor according to the present embodiment, when the voltage difference between the drain electrode and the source electrode is 0.1V or 10V, the threshold voltages have no bias (that is no positive bias nor negative bias), which improves the stability of the units.

Furthermore, the material of the active layer 130 can be indium gallium zinc oxide (In—Ga—Zn—O, IGZO), which is not limited. The concentration of the hydrogen ion in the passivation layer 160 is higher than that in the gate insulating layer 140. The IGZO easily forms n-type doping under the affect of the hydrogen ion. Therefore, the active layer 130 forms the structure having two end regions (a first zone 131 and a second zone 132) of n-type heavily doped region (the region having higher concentration of hydrogen ion) and a middle region 133 of n-type region. Therefore, the source electrode 170 and the drain electrode 180 respectively contact with the first zone 131 and the second zone 132, which reduces the contact resistance between the source electrode 170 and the active layer 130, and between the drain electrode 180 and the active layer 130, and then improves the output efficiency of the units.

Figure 4A:
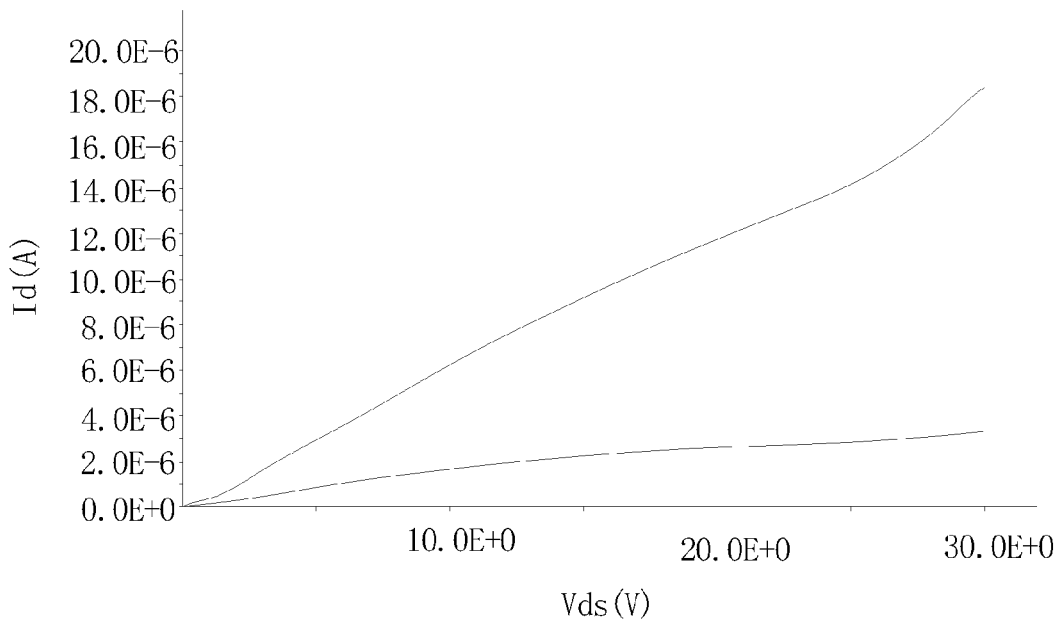
FIG. 4a is the output characteristic curve of the thin film transistor according to the existing technology.
Figure 4B:
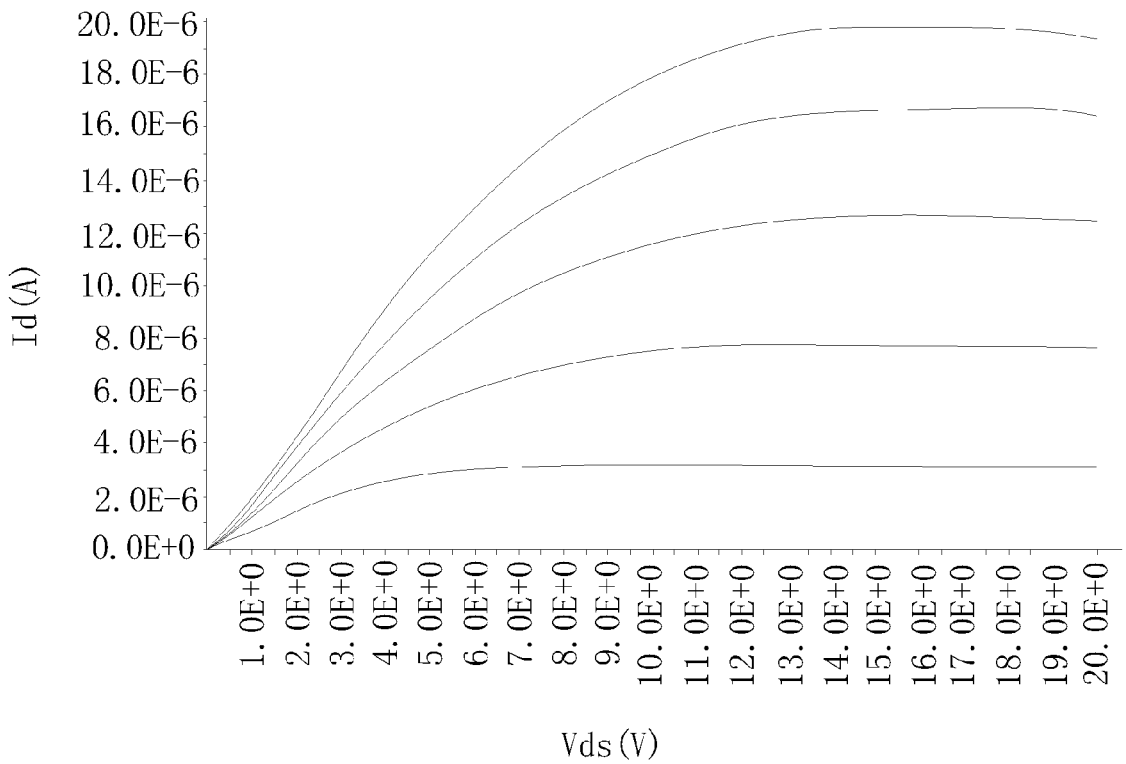
FIG. 4b is the output characteristic curve of the thin film transistor shown in FIG. 2.

FIG. 4a is the output characteristic curve of the thin film transistor according to the existing technology; FIG. 4b is the output characteristic curve of the thin film transistor according to the present embodiment.

Referring to FIG. 4a, the output current Id of the thin film transistor according to the existing technology is increased proportional to the voltage difference Vds between the drain and the source. Referring to FIG. 4b, the output current Id of the thin film transistor according to the present embodiment is gradually saturated as the increase of the voltage difference Vds between the drain and the source. Moreover, comparing the output characteristic curve of the thin film transistor according to the present embodiment shown in FIG. 4b with that of the thin film transistor according to the existing technology shown in FIG. 4a, when the voltage differences Vds between the drain and the source are the same, the output current Id in the output characteristic curve shown in FIG. 4b is higher. Therefore, it can obtain larger output efficiency. And, the resistance of the thin film transistor according to the present embodiment (the ratio of the voltage differences Vds between the drain and the source to the output current Id in the output characteristic curve shown in FIG. 4b) is lower.

Figure 5:
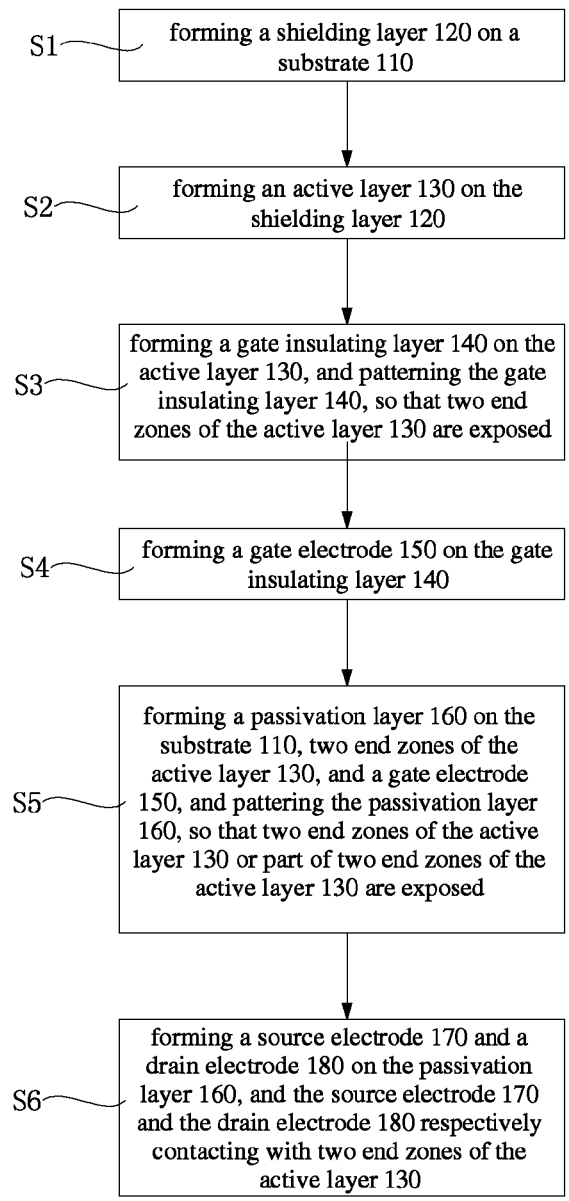
FIG. 5 is the flow chart of the manufacturing method of the thin film transistor according to an embodiment of the present invention.

The present invention further provides a manufacturing method of thin film transistor, for detail, refer to FIG. 5. FIG. 5 is the flow chart of the manufacturing method of the thin film transistor according to an embodiment of the present invention.

Referring to FIGS. 2 and 5 together, the manufacturing method of the thin film transistor according to an embodiment of the present invention comprises the following steps.

S1, forming a shielding layer 120 on a substrate 110. In the step, the shielding layer 120 is deposited on a substrate 110, which is used to absorb external light and then protects the units of the thin film transistor according to the present embodiment. The material of the substrate 110 is glass; of course, it can be flexible plastic in the other embodiments.

S2, forming an active layer 130 on the shielding layer 120. In the step, the active layer 130 is a semiconductor layer deposited on the shielding layer 120 as a conductive channel, the material of which is indium gallium zinc oxide (In—Ga—Zn—O, IGZO) in the present embodiment.

S3, forming a gate insulating layer 140 on the active layer 130, and patterning the gate insulating layer 140 (for example, using a gate insulating layer mask to pattern the gate insulating layer 140), so that two end zones (a first zone 131 and a second zone 132) of the active layer 130 are exposed. In the step, the gate insulating layer 140 is an insulating layer deposited on the active layer 130. In the present embodiment, the material of the gate insulating layer 140 can be silicon oxide; of course, it can be other insulating materials such as silicon nitride in the other embodiments. The ratio of using gases as depositing the gate insulating layer 140 is $SiH_4/N_2O<1/65$.

S4, forming a gate electrode 150 on the gate insulating layer 140. In the step, the gate electrode 150 is a metal conductor deposited on the gate insulating layer 140, which is used to receive the gate driving signal, the material of which is selected from the group consisting of Cr, Ti, Al, Mo, Cu, and Nd. Moreover, the gate electrode 150 is only deposited on the gate insulating layer 140 without covering the first zone 131 and the second zone 132.

S5, forming a passivation layer 160 on the substrate 110, the first zone 131, the second zone 132, and a gate electrode 150, and pattering the passivation layer 160 (for example, using a passivation layer mask to pattern the gate insulating layer 140), so that the two end zones (the first zone 131 and the second zone 132) of the active layer 130 or part of two end zones (the first zone 131 and the second zone 132) of the active layer 130 are exposed. In the step, the passivation layer 160 is an insulating layer, the material of which can be silicon oxide; of course, it can be other insulating materials such as silicon nitride in the other embodiments. The ratio of using gases as depositing the passivation layer 160 is $SiH_4/N_2O>1/50$, so that the two end regions (a first zone 131 and a second zone 132) of the active layer 130 form n-type heavily doped region.

S6, forming a source electrode 170 and a drain electrode 180 on the passivation layer 160, and the source electrode 170 and the drain electrode 180 respectively contacting with the first zone 131 and the second zone 132. Because the source electrode 170 and the drain electrode 180 respectively contact with the first zone 131 and the second zone 132 of n-type heavily doped regions, it can effectively reduce the contact resistance between the between the source electrode 170 and the active layer 130, and between the drain electrode 180 and the active layer 130. In the step, the source electrode 170 is a metal conductor deposited on the first zone 131 of the active layer 130 and the metal conductor on the one side of the passivation layer 160, which is used to receive the source driving signal, the material of which is selected from the group consisting of Cr, Ti, Al, Mo, Cu, and Nd. The drain electrode 180 is a metal conductor deposited on the second zone 132 of the active layer 130 and the metal conductor on the other side of the passivation layer 160, which is used to receive the drain driving signal, the material of which is selected from the group consisting of Cr, Ti, Al, Mo, Cu, and Nd. Moreover, the gate electrode 150 is located between the source electrode 170 and the drain electrode 180, and the three are separated from each other.

In addition, in the step of S1, the specific implementation of forming a shielding layer on a substrate in the step S1 comprises the following steps.

S11, forming a metal layer 121 on the substrate 110. In the step, the metal layer 121 is used to absorb the external light, the material of which is preferably chromium and/or chromium oxide.

S12, forming an insulating layer 122 on the metal layer 121. In the step, the insulating layer 122 is used to separate the active layer 130 and the metal layer 121, the material of which is preferably silicon oxide, which can simplify the process. Of course, the material of the insulating layer 122 according to the other embodiments can be silicon nitride.

The thin film transistor according to an embodiment of the present invention or the manufacturing method of thin film transistor according to an embodiment of the present invention is usually used in the liquid crystal panel. For details, refer to FIGS. 6 and 7.

Figure 6:
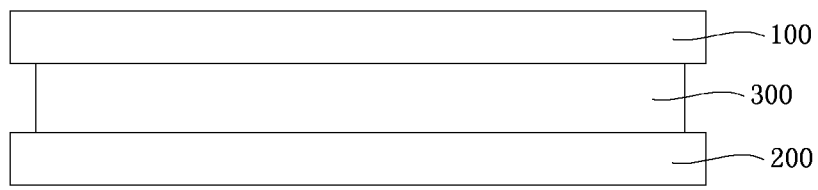
FIG. 6 is a schematic view illustrating the structure of a liquid crystal panel according to an embodiment of the present invention.
Figure 7:
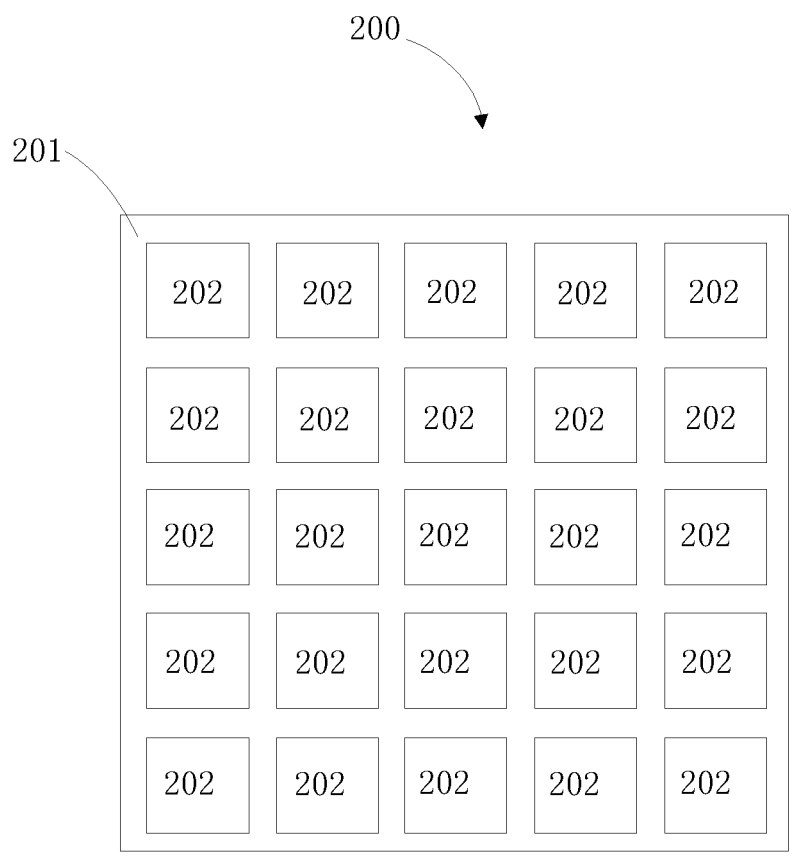
FIG. 7 is a schematic view illustrating the structure of a thin film transistor array substrate according to an embodiment of the present invention.

FIG. 6 is a schematic view illustrating the structure of a liquid crystal panel according to an embodiment of the present invention. FIG. 7 is a schematic view illustrating the structure of a thin film transistor array substrate according to an embodiment of the present invention.

Referring to FIGS. 6 and 7, the liquid crystal panel according to an embodiment of the present invention comprises a color filter substrate 100, a thin film transistor array substrate 200, and a liquid crystal layer 300 provided between the color filter substrate 100 and the thin film transistor array substrate 200. The liquid crystal layer 300 comprises multiple liquid molecules. The color filter substrate 100 provided opposite to the thin film transistor array substrate 200 is also called as CF substrate, which usually comprises a transparent substrate (such as glass substrate) and a black matrix pattern, a color resist layer (such as red (R), green (G), and blue (B) filter pattern), and an alignment layer provided on the transparent substrate. Due to the color filter substrate 100 used in the present invention is the same as the color filter substrate used in the existing liquid crystal panel, the specific structure can refer to the prior art, which is not repeated here.

The thin film transistor array substrate 200 is also called as TFT substrate, which usually comprises a transparent substrate (such as glass substrate) 201 and multiple thin film transistors 202 arrayed on the transparent substrate 201, which mainly provides driving voltage for the liquid crystal molecules in the liquid crystal layer 300 and rotates the liquid crystal molecules, so that the light can pass through the color filter substrate 100, and the liquid crystal panel displays images. Wherein, the thin film transistors 202 are the thin film transistor mentioned above or the thin film transistor made by the manufacturing method of thin film transistor mentioned above.

In summary, the thin film transistor according to the present invention adds a shielding layer to absorb external light, which reduces the effects of light on the device performance, increases the stability of the device, and then improves the quality of the flat panel display. At the same time, the thin film transistor utilizes a heavily doped n-type semiconductor to contact with the source electrode and the drain electrode, which reduces the contact resistance and increases output efficiency of the device. Moreover, the thin film transistor can follow the existing process, which facilitates mass production.

It needs to notice that, in this article, the relational terms such as first and second is only used to distinguish one entity or operating another entity or an operation, it is not necessary to require or imply that there exists any such relationship or sequence between the entity and operation. Besides, the terms "comprise," "include," or any other variation are intended to cover a non-exclusive inclusion, thereby making that comprising a series of process, method, materials or apparatus of element not only comprise those elements, but also comprise other elements not expressly listed, or also comprise such inherent elements of process, method, materials or apparatus. In the absence of more restrictive conditions, limiting the elements by the statement "comprises a . . . ", it doesn't exclude that it also exists other identical elements in comprising the process, method, materials or apparatus of element.

The preferred embodiments of the present invention have been described. It should be noted that, for those having ordinary skills in the art, any deduction or modification according to the present invention is considered encompassed in the scope of protection defined by the claims of the present invention.

What is claimed is:

1. A manufacturing method of thin film transistor, comprising the following steps:
    A. forming a shielding layer on a substrate;
    B. forming an active layer on the shielding layer;
    C. forming a gate insulating layer on the active layer, and patterning the gate insulating layer, so that a first zone and a second zone of the active layer are exposed;
    D. forming a gate electrode on the gate insulating layer;
    E. forming a passivation layer on the substrate, the first zone, the second zone, and a gate electrode, and patterning the passivation layer, so that the first zone and the second zone are exposed;
    F. forming a source electrode and a drain electrode on the passivation layer, and the source electrode and the drain electrode respectively contacting with the first zone and the second zone; and
    wherein a ratio of using gases as depositing the gate insulating layer is $SiH_4/N_2O<1/65$, and the ratio of using gases as depositing the passivation layer is $SiH_4/N_2O>1/50$.

2. The manufacturing method as claimed in claim 1, wherein the specific implementation of forming a shielding layer on a substrate in the step A is:
    A1. forming a metal layer on the substrate;
    A2. forming an insulating layer on the metal layer.

3. The manufacturing method as claimed in claim 1, wherein the material of the active layer is indium gallium zinc oxide.

4. The manufacturing method as claimed in claim 2, wherein the material of the active layer is indium gallium zinc oxide.

5. The manufacturing method as claimed in claim 3, wherein the first zone of the active layer and the second zone are n-type heavily doped region.

6. The manufacturing method as claimed in claim 4, wherein the first zone of the active layer and the second zone are n-type heavily doped region.

* * * * *